(12) United States Patent
Ihn et al.

(10) Patent No.: US 6,200,837 B1
(45) Date of Patent: Mar. 13, 2001

(54) METHOD OF MANUFACTURING THIN FILM TRANSISTOR

(75) Inventors: Tae Hyung Ihn; Kyung Ha Lee; Chang Yong Jeong, all of Seoul (KR)

(73) Assignee: Hyundai Electronics Industries Co., Ltd., Kyounki-do (KR)

( * ) Notice: Subject to any disclaimer, the term of this patent is extended or adjusted under 35 U.S.C. 154(b) by 0 days.

(21) Appl. No.: 09/340,010

(22) Filed: Jun. 25, 1999

(30) Foreign Application Priority Data

Jun. 30, 1998 (KR) ................................................ 98-25839

(51) Int. Cl.$^7$ ...................................................... H01L 21/00
(52) U.S. Cl. ............................................. 438/166; 438/166
(58) Field of Search ..................................... 438/150, 166, 438/471, 476, 762, 764, 482, 486, 151, 692, 152, 301

(56) References Cited

U.S. PATENT DOCUMENTS

| 5,550,070 | * | 8/1996 | Funai et al. | 437/41 |
| 5,616,506 | * | 4/1997 | Takemura | 438/150 |
| 5,849,612 | * | 12/1998 | Takahashi et al. | 438/151 |
| 5,869,363 | * | 2/1999 | Yamazaki et al. | 438/166 |
| 5,985,740 | * | 11/1999 | Yamazaki et al. | 438/486 |

FOREIGN PATENT DOCUMENTS

| 563196 | 3/1993 | (JP) . |
| 645607 | 2/1994 | (JP) . |
| 677484 | 3/1994 | (JP) . |
| 6252405 | 9/1994 | (JP) . |
| 7273347 | 10/1995 | (JP) . |
| 883911 | 3/1996 | (JP) . |
| 888172 | 4/1996 | (JP) . |
| 8330597 | 12/1996 | (JP) . |
| 9107107 | 4/1997 | (JP) . |
| 10200120 | 7/1998 | (JP) . |
| 10209460 | 8/1998 | (JP) . |

* cited by examiner

Primary Examiner—David Nelms
Assistant Examiner—David Nhu
(74) Attorney, Agent, or Firm—Selitto & Associates, P.C.

(57) ABSTRACT

A method of manufacturing a TFT which can improve realibility by planarizing the surface of a polysilicon layer as a channel layer, is disclosed.

According to the present invention, an amorphous silicon layer is formed on an insulating layer substrate and crystallized by excimer layer annealing process, to form a polysilicon layer. Next, the surface of the polysilicon layer is oxidized to form an oxide layer. At this time the sufrace of the polsyilicon under the oxide layer become smooth. Preferably, the oxide layer is formed by oxiation process using ECR (Electron Cyclon Resonator) plasma or using one selected from the group consisting of $O_2$, $O_2N_2$, $O_2N_2O$, $O_2NH_3$ and NO. Thereafter, the oxide layer is removed to expose the polysilicon layer and then a gate insulating layer is formed on the exposed polysilicon layer. Preferably, the gate insulating layer is formed to one selected from the group consisting of a $SiO_2$ layer, a SiN layer, a SiON layer and a TEOS oxide layer. The gate insulating layer is formed by ECR plasma oxidiation process or ECR PECVD.

8 Claims, 2 Drawing Sheets

METHOD OF MANUFACTURING THIN FILM TRANSISTOR

BACKGROUND OF THE INVENTION

1. Field of the Invention

The present invention relates to a method of manufacturing a thin film transistor, and more particularly to a method of manufacturing a thin film transistor using a polysilicon layer as a channel layer.

2. Description of the Related Art

In general, an active matrix type-liquid crystal display (AM-LCD) device is thin, so that it is often used in various display devices. In this AM-LCD device, one TFT is provided as a switching element for each pixel, so that individual pixel electrodes are independently driven.

In this display device, a glass substrate is used for a substrate material, for reducing cost. In this case, process must be performed at the low temperature of about 600° C., considering the softening temperature of the glass. Therefore, in case a polysilicon layer is used as a channel layer, an amorphous silicon layer is crystallized by a laser annealing capable of thermally treating at the low temperature of 600° C. or less, thereby forming the polysilicon layer. In this laser annealing, since fever is momently transmitted to the surface of the amorphous silicon layer, not to have on effect on the glass substrate, it is possible to crystallize the amorphous silicon layer without occurring the transformation of the substrate.

However, when crystallizing the amorphous silicon layer, a liquid state and a solid state coexist therein, so that the grain boundary of the polysilicon layer is projected due to the density difference of the two states, thereby generating hillock on the surface of the polysilicon layer. As a result, the surface of the polysilicon layer becomes rough, thereby deteriorating the properties of the TFT. For example, electric field is locally concentrated on the channel so layer of the TFT and leakage current occurs. Furthermore, the property of a gate insulating layer formed on the polysilicon layer is deteriorated. Accordingly, the reliability and the reproductivity are deteriorated.

SUMMARY OF THE INVENTION

It is therefore an object of the present invention to a method of manufacturing a TFT which can improve reliability by planarizing the surface of a polysilicon layer as a channel layer.

To accomplish this above object, according to the present invention, an amorphous silicon layer is formed on an insulating layer substrate and crystallized by excimer laser annealing process, to form a polysilicon layer. Next, the surface of the polysilicon layer is oxidized to form an oxide layer. At this time, the surface of the polysilicon under the oxide layer become smooth. Preferably, the oxide layer is formed by oxidation process using ECR(Electron Cyclon Resonator) plasma or using one selected from the group consisting of $O_2$, $O_2N_2$, $O_2N_2O$, $O_2NH_3$ and NO. Thereafter, the oxide layer is removed to expose the polysilicon layer and then a gate insulating layer is formed on the exposed polysilicon layer. Preferably, the gate insulating layer is formed to one selected from the group consisting of a $SiO_2$ layer, a SiN layer, a SiON layer and a TEOS oxide layer. The gate insulating layer is formed by ECR plasma oxidation process or ECR PECVD.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, a preferred embodiment of the present invention will be explained in more detail with reference to accompanying drawings.

Figure 1A:
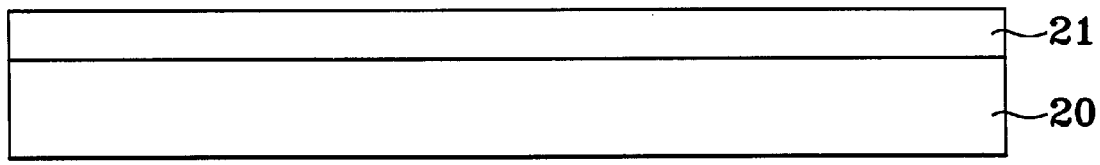
FIG. 1A to FIG. 1E show cross sectional views for describing a method of manufacturing a TFT using a polysilicon layer as a channel layer according to an embodiment of the present invention.
Figure 1B:
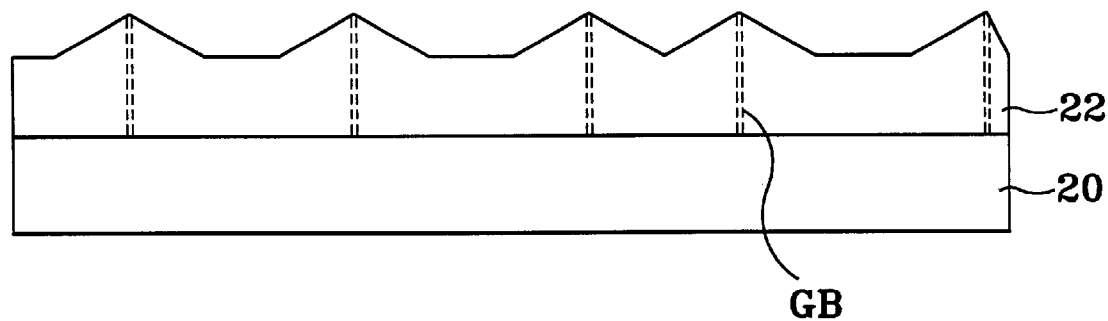

Referring to FIG. 1A, an amorphous silicon layer 21 is formed on a transparent insulating layer 20 such as a glass. The amorphous silicon layer 21 is crystallized by an excimer laser annealing process, to form a polysilicon layer 22. At this time, the grain boundary GB of the polysilicon layer is projected due to the density differnce of a liquid stat and a solid state, so that hillock is generated on the surface of the polysilicon layer 22, as shown in FIG. 1B. As a result, the surface of the polysilicon layer 22 becomes rough.

Figure 1C:
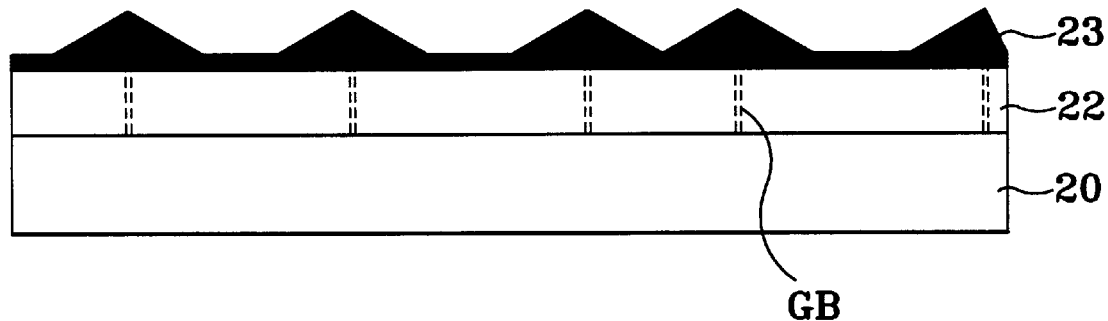

In this embodiment, to planarize the surface of the polysilicon layer 22, an oxide layer 23 is formed thereon by oxidizing the surface thereof, as shown in FIG. 1C. At this time, since oxidation of the polysilicon layer 22 is faster at the grain boundary GB than at the particle, the surface of the polysilicon layer 22 under the oxide layer 23 becomes smooth. Preferably, the oxide layer 23 is formed by oxiation process using ECR(Electron Cyclon Resonator) plasma or using one selected from the group consisting of $O_2$, $O_2N_2$, $O_2N_2O$, $O_2NH_3$ and NO.

Figure 1D:
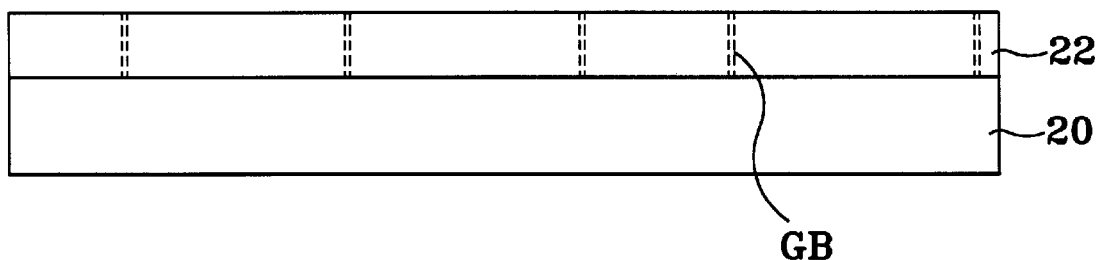
Figure 1E:
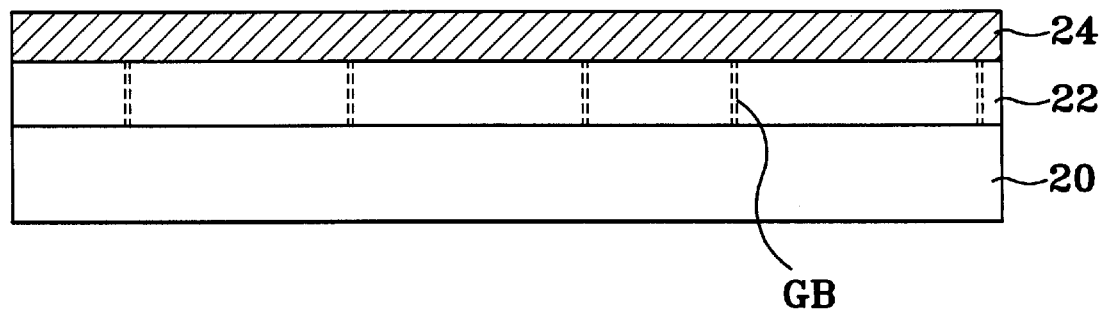

Thereafter, the oxide layer 23 is removed by etching, to expose the polysilicon layer 22 of which the surface is smooth, as shown in FIG. 1D. A gate insulating layer 24 is then formed on the exposed polysilicon layer 22, as shown in FIG. 1E. Preferably, the gate insulating layer 24 is formed to one selected from the group consisting of a $SiO_2$ layer, a SiN layer, a SiON layer and a TEOS oxide layer. The gate insulating 24 is also formed by ECR plasm oxidiation process or ECR PECVD(Plasma Enhanced Chemical Vapor Deposition).

Next, as not shown in the drawings, a gate electrode and source/drain electrodes are formed, to complete a TFT.

According to the present invention, owing to the oxidation difference between the grain boundary and the partice of the polysilicon layer, the surface of the polysilicon layer under the oxide layer becomes smooth, after performing oxidation process. Therefore, it is possible to obtain the polysilicon layer of which surface is smooth after removing the oxide layer. As a result, prior problems such as local electric field concentration on a channel layer of the TFT, the vibration of threshold voltage and leakage current occurrence, due to the rough surface of the polysilicon layer are substantially prevented. Furthermore, the property of a gate insulating layer is improved. Accordingly, the realibility and the reproductivity are improved.

Although the preferred embodiment of this invention has been disclosed for illustrative purpose, those skilled in the art will appreciate that various modification, additions and substitutions are possible, without from the scope and spirit of the invention as described in the accompanying claims.

What is claimed is:

1. A method of manufacturing a thin film transistor having a polysilicon layer as a channel layer, comprising the steps of:

forming an amorphous silicon layer on an insulating layer;

crystalizing the amorphous silicon layer to form a polysilicon layer, wherein the polysilicon layer has grain boundaries formed therein and a rough surface including first portions adjacent the grain boundaries and second portions remote from the grain boundaries;

oxidizing the rough surface of the polysilicon layer to form an oxide layer, wherein the oxidizing step is performed so as to oxidize the first portions of the rough surface of the polysilicon layer at a rate faster than the rate at which the second portions of the rough surface of the polysilicon layer are oxidized such that the interface between the polysilicon layer and the oxide layer is substantially planar; and removing the oxide layer to expose the polysilicon layer having a smooth surface.

2. The method according to claim 1, wherein the step of the crystallizing is performed by an excimer laser annealing process.

3. The method according to claim 1, wherein the oxidizing step is performed by an electron cyclon resonator plasma oxidation process.

4. The method according to claim 1, wherein the oxidizing step is performed by an oxidation process using one selected from the group consisting of $O_2$, $O_2N_2$, $O_2N_2O$, $O_2NH_3$ and NO.

5. The method according to claim 1, further comprising the step of forming a gate insulating layer on the exposed polysilicon layer.

6. The method according to claim 5, wherein the gate insulating layer is formed to one selected from the group consisting of a $SiO_2$ layer, a SiN layer, a SiON layer and a TEOS oxide layer.

7. The method according to claim 6, wherein the gate insulating layer is formed by an electron cyclon resonator plasma oxidation process.

8. The method according to claim 6, wherein the gate insulating layer formed by electron cyclon resonator plasm enhanced chemical vapor deposition.

* * * * *